(12) United States Patent
Tetelbaum

(10) Patent No.: US 7,076,406 B1
(45) Date of Patent: Jul. 11, 2006

(54) MINIMAL BENDS CONNECTION MODELS FOR WIRE DENSITY CALCULATION

(75) Inventor: Alexander Tetelbaum, Hayward, CA (US)

(73) Assignee: LSI Logic Corporation, Milpitas, CA (US)

( * ) Notice: Subject to any disclaimer, the term of this patent is extended or adjusted under 35 U.S.C. 154(b) by 832 days.

(21) Appl. No.: 09/849,691

(22) Filed: May 4, 2001

(51) Int. Cl.
*G06F 7/60* (2006.01)
*G06F 17/50* (2006.01)
*G06F 9/45* (2006.01)
*G06F 9/302* (2006.01)

(52) U.S. Cl. ............................................. 703/2; 716/5
(58) Field of Classification Search ................ 703/2; 716/2, 7, 8, 12, 20, 5
See application file for complete search history.

(56) References Cited

U.S. PATENT DOCUMENTS

| | | | | |
|---|---|---|---|---|
| 5,311,443 A * | 5/1994 | Crain et al. | ..................... | 716/10 |
| 5,587,923 A | 12/1996 | Wang | | |
| 5,701,255 A * | 12/1997 | Fukui | ......................... | 716/12 |
| 5,784,289 A * | 7/1998 | Wang | ............................ | 716/8 |
| 6,067,409 A * | 5/2000 | Scepanovic et al. | ........... | 716/8 |
| 6,348,813 B1 * | 2/2002 | Agrawal et al. | ............... | 326/41 |
| 6,442,745 B1 * | 8/2002 | Arunachalam et al. | ....... | 716/13 |
| 6,480,991 B1 * | 11/2002 | Cho et al. | ....................... | 716/8 |
| 2003/0005398 A1 * | 1/2003 | Cho et al. | ....................... | 716/8 |

OTHER PUBLICATIONS

Lou et al, "Estimating Routing Congestion Using Probabilistic Analysis", Proceedings of the 2001 International Symposium on Physical Design, pp. 112-117, Apr. 1-4, 2001.*

Bazargan et al, "Fast and accurate estimation of floorplans in logic/high-level synthesis", Proceedings of the 10th Great Lakes symposium on VLSI, pp. : 95-100,2000.*

Burstein et al, "Hierarchical Wire Routing", Computer-Aided Design of Integrated Circuits and Systems, IEEE Transactions on, vol. : 2 , Issue: 4 , Oct. 1983,pp. :223-234.*

Vijayan, Gopalakrishnan, "Partitioning logic to optimize routability on graph structures", Circuits and Systems, 1990., IEEE International Symposium on, May 1-3, 1990, pp. :2638-2641 vol. 4.*

Sarrafzadeh et al., "Single-Layer Global Routing" IEEE 1994 p. 38-47.*

* cited by examiner

*Primary Examiner*—Paul L. Rodriguez
*Assistant Examiner*—Tom Stevens
(74) *Attorney, Agent, or Firm*—Trexler, Bushnell, Giangiorgi, Blackstone & Marr, Ltd.

(57) ABSTRACT

A method of accurately estimating horizontal and vertical wire densities in a datapath or hardmac. The method provides that the datapath or hardmac is divided into areas, and mathematical expectations are calculated for full and partial horizontal and vertical segments for each of the areas. The mathematical expectations are summed for both the horizontal and vertical segments, and this is done for each connection within the datapath or hardmac in order to estimate both horizontal and vertical wire densities. A congestion map can be created, and 100% detail routing is effectively guaranteed as a result of using the method. Preferably, a model with minimum bends is used in areas with low wire density, and models with more bends are used in areas with middle and high wire density.

14 Claims, 10 Drawing Sheets

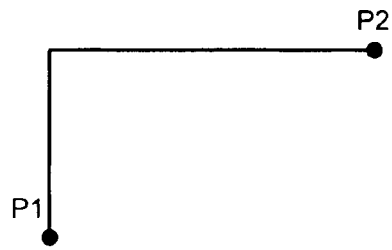
FIG. 9a  FIG. 9b
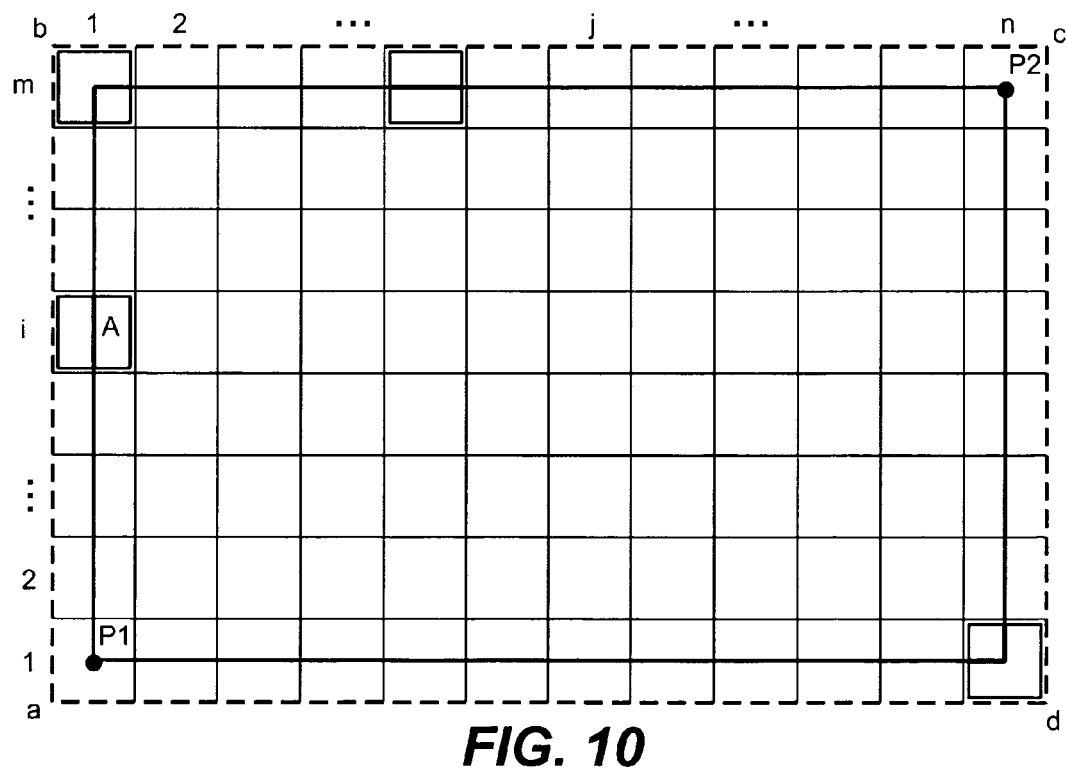
FIG. 10

| b | 1 | 2 | ... | | | j | | ... | | n | c |
|---|---|---|---|---|---|---|---|---|---|---|---|
| m | 0.25 | 0.5 | 0.5 | ... | | 0.5 | | ... | 0.5 | 0.5 | 0.25 ● P2 |
| | 0 | 0 | ... | | | 0 | | ... | | 0 | 0 | 0 |
| ⋮ | ⋮ | | | | | | | | | | |
| i | | | | | | | | | | | |
| | | | | | | | | | | | |
| ⋮ | | | | | | | | | | | |
| 2 | 0 | 0 | ... | | | 0 | | ... | | 0 | 0 | 0 |
| 1 | P1 ● 0.25 | 0.5 | 0.5 | ... | | 0.5 | | ... | 0.5 | 0.5 | 0.25 |
| a | | | | | | | | | | | d |

FIG. 13

| b | 1 | 2 | ... | | | j | | ... | | n | c |
|---|---|---|---|---|---|---|---|---|---|---|---|
| m | 0.25 | 0 | 0 | ... | | 0 | | ... | 0 | 0 | 0.25 ● P2 |
| | 0.5 | 0 | ... | | | 0 | | ... | | 0 | 0 | 0.5 |
| ⋮ | 0.5 | | | | | | | | | | 0.5 |
| i | ⋮ | | | | | | | | | | |
| | | | | | | | | | | | |
| ⋮ | | | | | | | | | | | |
| 2 | 0.5 | 0 | ... | | | 0 | | ... | | 0 | 0 | 0.5 |
| 1 | P1 ● 0.25 | 0 | 0 | ... | | 0 | | ... | | 0 | 0 | 0.25 |
| a | | | | | | | | | | | d |

FIG. 16

| | 1 | 2 | ... | j | ... | n-2 | n-1 | n |
|---|---|---|---|---|---|---|---|---|
| m | $\frac{0.25}{n}$ | $\frac{1}{n}$ | $\frac{1.5}{n}$ ... | $\frac{0.5j}{n}$ | ... | $\frac{0.5(n-2)}{n}$ | $\frac{0.5(n-1)}{n}$ | 0.25 ● P2 |
| | 0 | 0 | ... | 0 | ... | 0 | 0 | 0 |
| ⋮ | ⋮ | | | | | | | |
| i | | | | | | | | |
| ⋮ | | | | | | | | |
| 2 | 0 | 0 | ... | 0 | ... | 0 | 0 | 0 |
| 1 | 0.25 ● P1 | $\frac{0.5(n-1)}{n}$ | $\frac{0.5(n-2)}{n}$ | ... | $\frac{0.5(n-j+1)}{n}$ | ... | $\frac{1.5}{n}$ | $\frac{1}{n}$ | $\frac{0.25}{n}$ |

FIG. 17

| | 1 | 2 | 3 | ... | n-2 | n-1 | n |
|---|---|---|---|---|---|---|---|
| m | $\frac{0.25(m+n)}{nm}$ | $\frac{0.5(2m+n)}{nm}$ | $\frac{0.5(3m+n)}{nm}$ | ... | $\frac{0.5(nm+n-2m)}{nm}$ | $\frac{0.5(nm+n-m)}{nm}$ | $\frac{0.25(m+1)}{nm}$ ● P2 |
| | 0.25/m | 0.5/m | 0.5/m | ... | 0.5/m | 0.5/m | 0.25/m |
| ⋮ | ⋮ | | | | | | |
| i | | | | | | | |
| ⋮ | | | | | | | |
| | 0.25/m | 0.5/m | 0.5/m | ... | 0.5/m | 0.5/m | 0.25/m |
| 2 | 0.25/m | 0.5/m | 0.5/m | ... | 0.5/m | 0.5/m | 0.25/m |
| 1 | $\frac{0.25(m+1)}{m}$ ● P1 | $\frac{0.5(mn+n-m)}{nm}$ | $\frac{0.5(nm+n-2m)}{nm}$ | ... | $\frac{0.5(3m+n)}{nm}$ | $\frac{0.5(2m+n)}{nm}$ | $\frac{0.25(m+n)}{nm}$ |

US 7,076,406 B1

MINIMAL BENDS CONNECTION MODELS FOR WIRE DENSITY CALCULATION

BACKGROUND

This invention generally relates to probabilistic models for calculating wire density in different areas of a datapath or hardmac, and more specifically relates to a probabilistic model which differentiates between horizontal and vertical segments.

FIG. 1 shows a general datapath structure. As shown, datapath cells are located in blocks (clusters) and control cells may be located in columns along left and right sides of the datapath and in blocks as well. Current datapaths are typically very large and complex, and require design datapath macros with complex hierarchical structures that have a high design quality. Additionally, complex constraints on the placement of cells, pins and nets, as well as the size of gaps between cells, blocks, etc. must be respected, and there must be guaranteed 100% detail routing.

One prior art approach for calculating wire density in different areas of a datapath is based on a simplified density model and is used for placement quality estimation only. The approach is not accurate, does not differentiate between vertical and horizontal segments of connections, does not take into account all possible shortest length configurations of connections, and is unacceptable for calculating a congestion map.

OBJECTS AND SUMMARY

A general object of an embodiment of the present invention is to provide a method of estimating wire densities which differentiates between horizontal and vertical segments.

Another object of an embodiment of the present invention is to provide a method of estimating wire densities which facilitates the formulation of a congestion map.

Still another object of an embodiment of the present invention is to provide a probabilistic model which takes into account all possible shortest length configurations of connections, thereby being sufficiently accurate to estimate wire density.

Briefly, and in accordance with at least one of the foregoing objects, an embodiment of the present invention provides a method of accurately estimating horizontal and vertical wire densities in a datapath or hardmac. The method provides that the datapath or hardmac is divided into areas, and mathematical expectations are calculated for full and partial horizontal and vertical segments for each of the areas. The mathematical expectations are summed for both the horizontal and vertical segments, and this is done for each connection within the datapath or hardmac in order to estimate both horizontal and vertical wire densities. A congestion map can be created, and 100% detail routing is effectively guaranteed as a result of using the method.

BRIEF DESCRIPTION OF THE DRAWINGS

The organization and manner of the structure and operation of the invention, together with further objects and advantages thereof, may best be understood by reference to the following description, taken in connection with the accompanying drawings, wherein like reference numerals identify like elements in which:

FIGS. 9a and 9b show two different minimum bends configurations;

FIG. 10 shows bounding area [a,b,c,d] and the four different ways in which a minimal bends connection can go through a given area;

FIG. 11a shows the horizontal probabilities for the configuration shown in FIG. 9a;

FIG. 11b shows the horizontal probabilities for the configuration shown in FIG. 9b;

FIG. 12 shows the overall horizontal probabilities for the configurations shown in FIGS. 9a and 9b;

FIG. 13 is similar to FIG. 12, but shows the overall vertical probabilities;

FIG. 15 shows the horizontal probabilities for the configuration shown in FIG. 14a;

FIG. 16 shows the horizontal probabilities for the configuration shown in FIG. 14b;

FIG. 17 shows the overall horizontal probabilities for the configurations shown in FIGS. 14a and 14b.

DESCRIPTION

Figure 1:
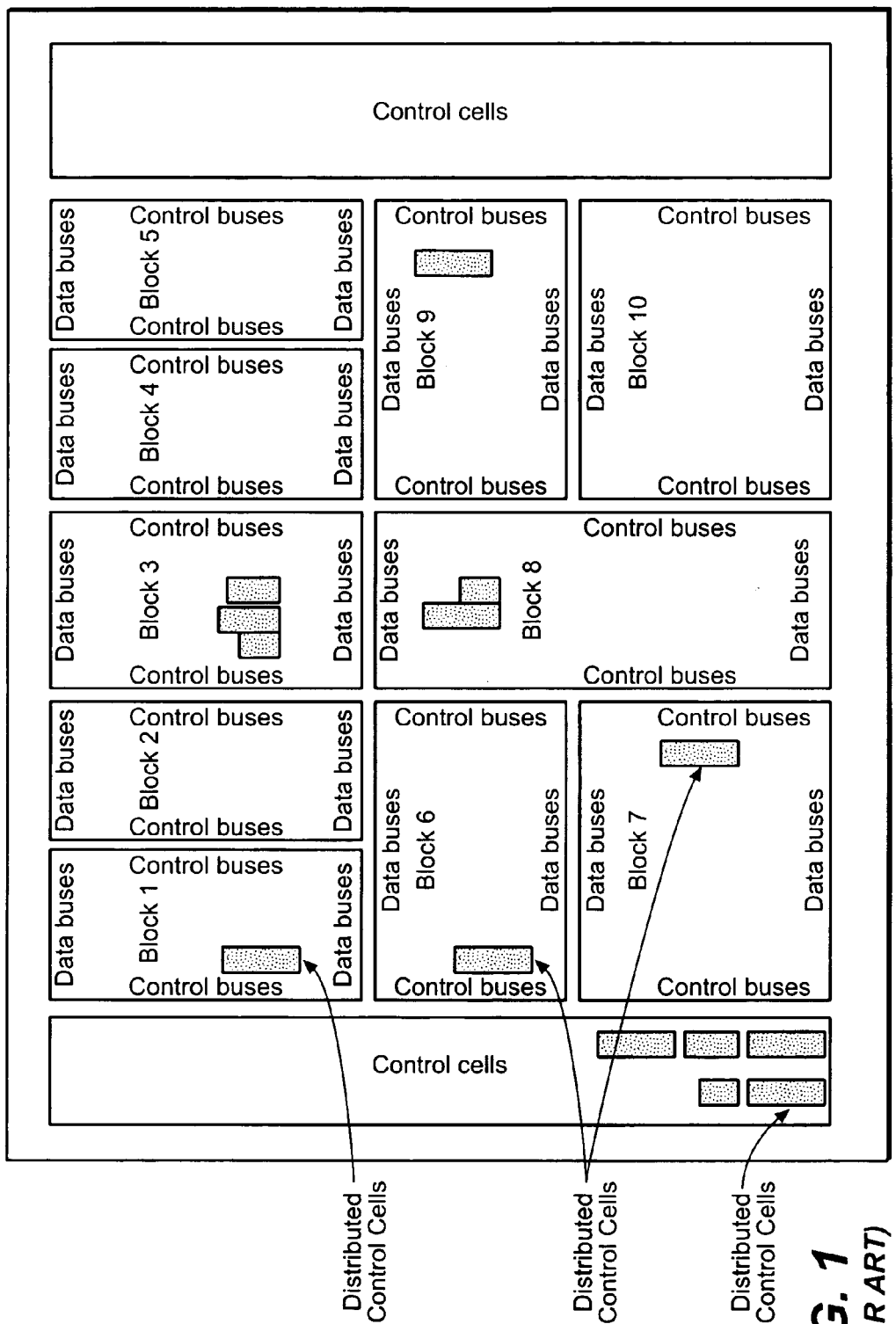
FIG. 1 is a general schematic diagram of a datapath structure.

While the invention may be susceptible to embodiment in different forms, there are shown in the drawings, and herein will be described in detail, specific embodiments with the understanding that the present disclosure is to be considered an exemplification of the principles of the invention, and is not intended to limit the invention to that as illustrated and described herein.

An embodiment of the present invention provides a probabilistic method for calculating wire density in different areas of the datapath (the term "datapath" is to be construed very broadly herein, as the term is used herein to mean any type of real estate) and other hardmacs with a given cell placement. The method is based on a probabilistic model of connection between two pins. The model takes into account all possible shortest length configurations of the connection, and differentiates between vertical and horizontal segments of the connection. Thus, the model is sufficiently accurate to be used for wire density estimation, and provides that congestion maps can be calculated.

Figure 2:
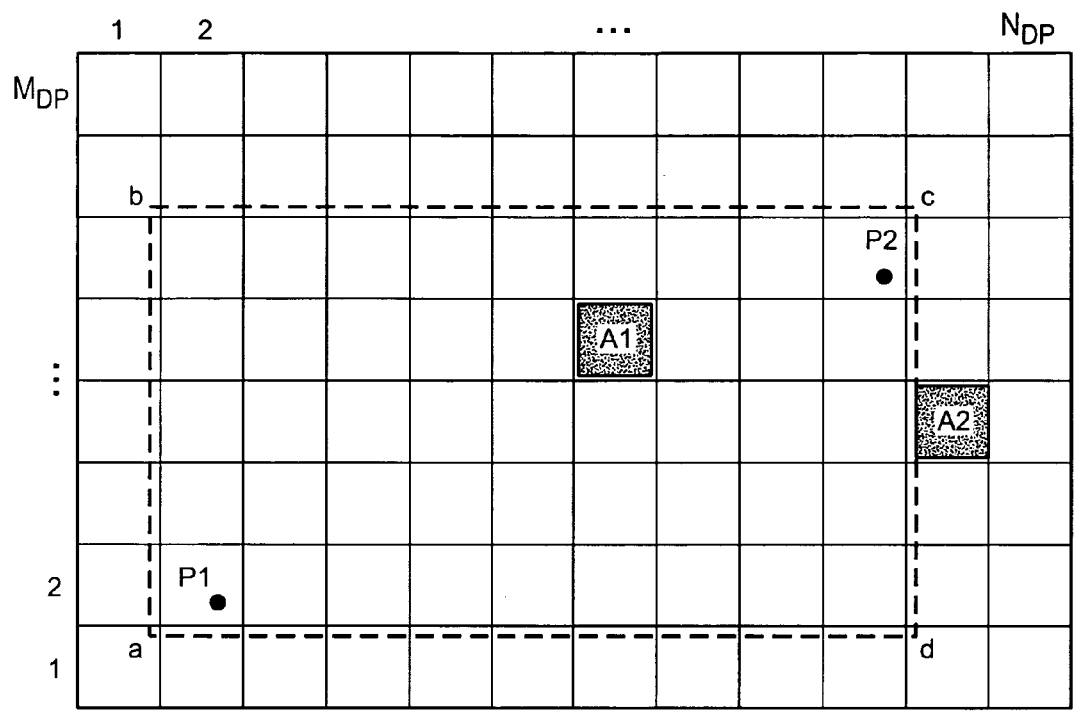
FIG. 2 is a general schematic diagram showing a datapath area divided into square areas, and two pins, P1 and P2, contained in the datapath area.
Figure 3:
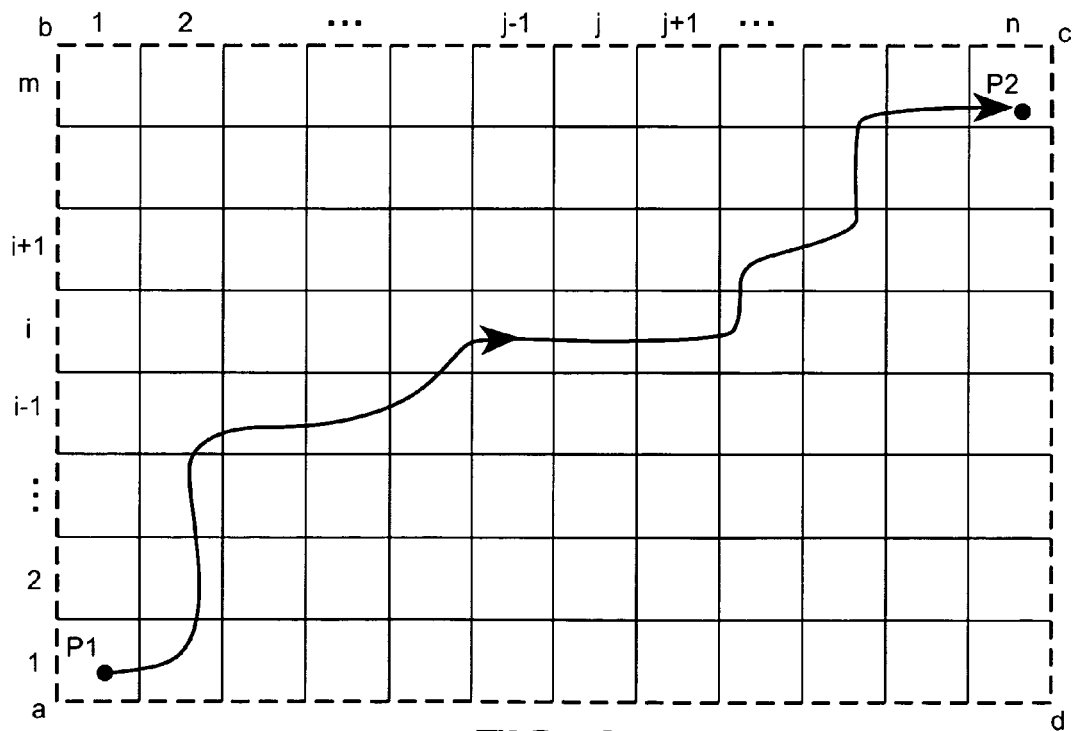
FIG. 3 is a general schematic diagram of a portion (i.e., rectangle [a,b,c,d]) of the area shown in FIG. 2.

Initially, as shown in FIG. 2, a datapath area is divided into $M_{DP}$ by $N_{DP}$ squared areas (effectively a matrix of columns and rows), where each area size is about equal to the width of placement columns or cell width. It is known that the number of the shortest length paths (configurations) from P1 to P2 (see FIG. 3) is:

$$N(P1, P2) = \binom{m-1}{n+m-2} = \frac{(m+n-2)!}{(m-1)! \cdot (n-1)!} \quad (1)$$

With regard to the possible shortest length configurations for connection C from pin P1 to pin P2 (see FIG. 1), it is known that any shortest length connection (P1, P2) will belong to rectangle [a,b,c,d]. Therefore, for any area A1 from [a,b,c,d] there exists some probability P(A1)>0 that connection (P1, P2) will go through this area, and for any area A2 outside [a,b,c,d] there is zero probability that connection (P1, P2) will go through this area. If the probability P(a) is known, then the mathematical expectation of area A having connection (P1, P2) can be calculated as being M(A)=P(A).

Figure 4A:
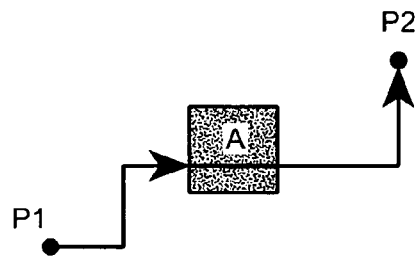
FIGS. 4a–4f show six different possible connection configurations in a given area A.
Figure 4B:
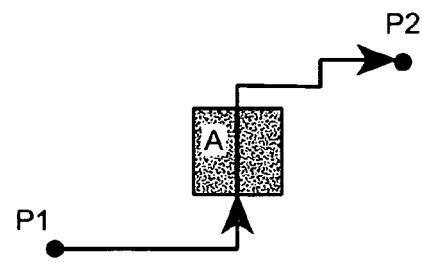
Figure 4C:
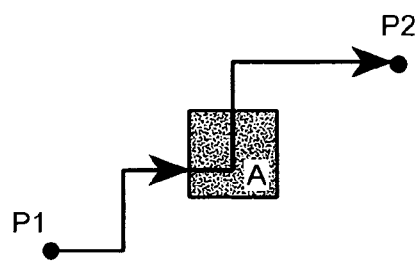
Figure 4D:
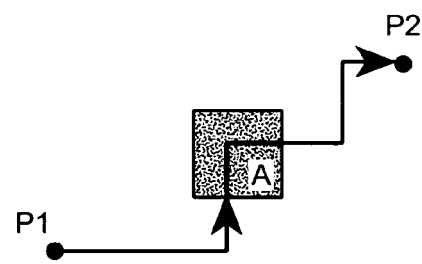
Figure 4E:
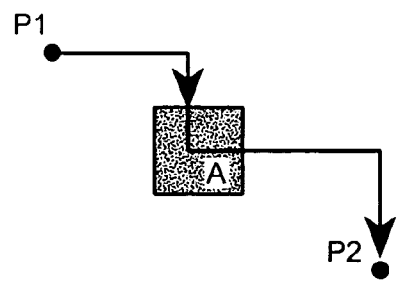
Figure 4F:
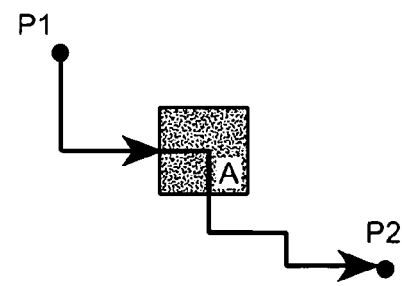

As shown in FIGS. 4a–4f, any connection (P1, P2) can go through area A in six different ways. The configurations shown in FIGS. 4a–4d are possible if pin P2 is higher than pin P1, and the configurations shown in FIGS. 4e and 4f are possible if pin P1 is higher than pin P2. The segment (i.e., the connection through area A) shown in FIG. 4a is a full horizontal segment, while the segment shown in FIG. 4b is a full vertical segment. Each one of the segments shown in FIGS. 4c–4e is both a partial horizontal and partial vertical segment.

The situation where pin P2 is higher than pin P1 (as shown in FIG. 2) will be discussed below. The analysis would be analogous in the case where pin P1 is higher than P2.

Figure 5:
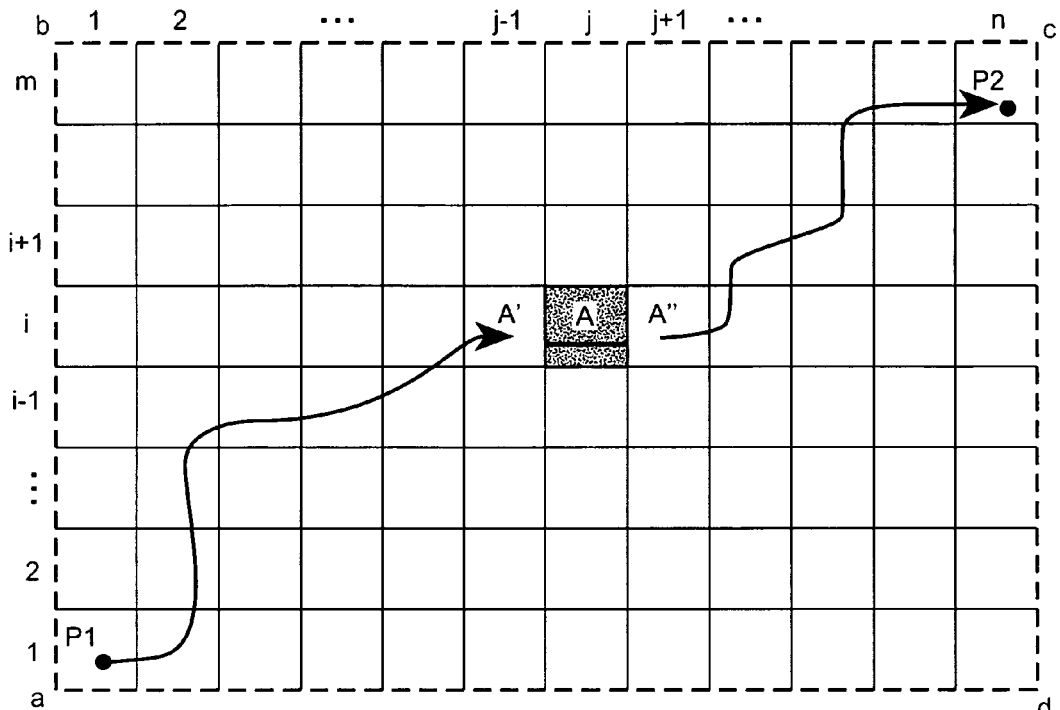
FIG. 5 is similar to FIG. 3, showing a full horizontal segment through area A in rectangle [a,b,c,d]
Figure 6:
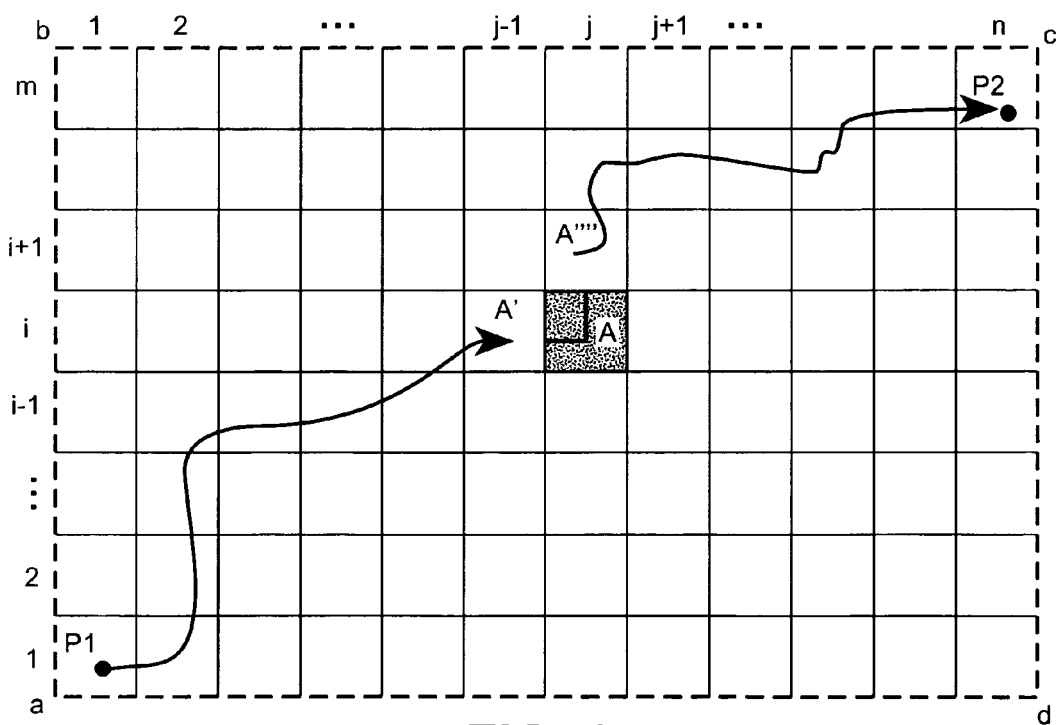
FIG. 6 is similar to FIG. 3, showing a partial horizontal segment through area A in rectangle [a,b,c,d]
Figure 7:
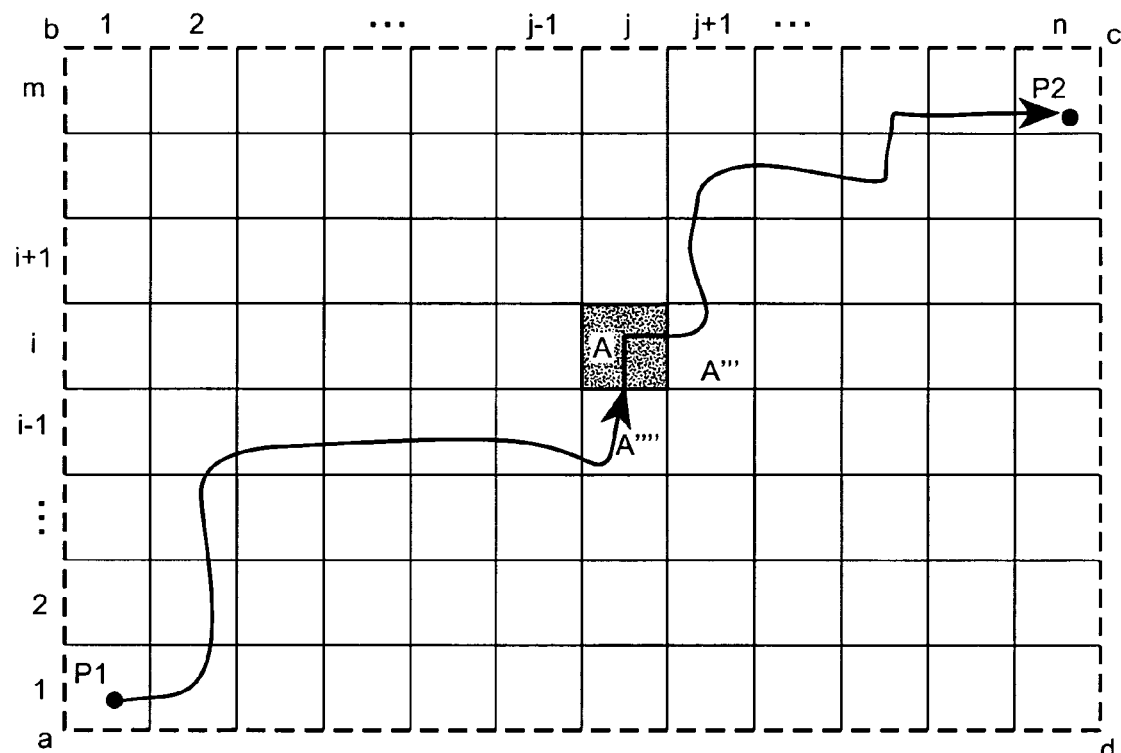
FIG. 7 is similar to FIG. 3, showing another type of partial horizontal segment through area A in rectangle [a,b,c,d]

FIG. 5 shows the rectangle [a,b,c,d] (see FIG. 2) wherein there is a full horizontal segment (see FIG. 4a) through area A (FIGS. 5–7 also show the numeration of the columns and rows which form the rectangle [a,b,c,d]). The mathematical expectations $M_{h1}(A)$ of full horizontal segments can be calculated as follows:

$$M_{h1}(A) = \frac{N(P1, A') \cdot N(A'', P2)}{N(P1, P2)} \quad (2)$$

where

N(P1, A') is the number of possible paths from P1 to area A';

N(A'', P2) is the number of possible paths from area A'' to P2; and

N(P1, P2) is the number of possible paths from P1 to P2.

Taking into account the formula (equation (1) above) for the number N(P1, P2) of paths between two points, all the numbers which are needed to calculate the mathematical expectation $M_{h1}(A)$ can be found:

$$N(P1, A') = \frac{(i+j-3)!}{(i-1)! \cdot (j-2)!} \quad (3)$$

$$N(A'', P2) = \frac{(m-i+n-j-1)!}{(m-i)! \cdot (n-j-1)!} \quad (4)$$

FIG. 6 shows the rectangle [a,b,c,d] (see FIG. 2) wherein there is a half or partial horizontal segment (see FIG. 4c) through area A. The mathematical expectations $M_{h2}(A)$ of half horizontal segments can be calculated as follows:

$$M_{h2}(A) = 0.5 \cdot \frac{N(P1, A') \cdot N(A''', P2)}{N(P1, P2)} \quad (5)$$

where

N(A''', P2) is the number of possible paths from area A''' to P2, and coefficient 0.5 indicates that there is only half of a horizontal segment in area A.

Taking into account the formula (equation (1) above) for the number N(P1, P2) of paths between two points, all the numbers which are needed to calculate the mathematical expectation $M_{h2}(A)$ can be found:

$$N(A''', P2) = \frac{(m-i+n-j-1)!}{(m-i-1)! \cdot (n-j)!} \quad (6)$$

FIG. 7 shows the rectangle [a,b,c,d] (see FIG. 2) wherein there is another type of half or partial horizontal segment (see FIG. 4d) through area A. The mathematical expectations $M_{h3}(A)$ of half horizontal segments can be calculated as follows:

$$M_{h3}(A) = 0.5 \cdot \frac{N(P1, A'''') \cdot N(A, P2)}{N(P1, P2)} \quad (7)$$

where

N(P1, A'''') is the number of possible paths from P1 to area A'''', and coefficient 0.5 indicates that there is only half of a horizontal segment in area A.

Taking into account the formula (equation (1) above) for the number N(P1, P2) of paths between two points, all the numbers which are needed to calculate the mathematical expectation $M_{h3}(A)$ can be found:

$$N(P1, A'''') = \frac{(i+j-3)!}{(i-2)! \cdot (j-1)!} \quad (8)$$

To determine the whole mathematical expectation $M_h^{All}(A)$ of all horizontal segments of all connections, the following summation is calculated:

$$M_h^{All}(A) = \sum_{c \in Connections} M_h^c(A) \quad (9)$$

where $M_h^c(A) = M_h(a)$ is the whole mathematical expectation of horizontal segments in area A for one connection c.

The same approach can be used to obtain formulas for vertical segments and the case where P1 is higher than P2.

From the formulas above, it can be concluded that the time complexity of the algorithm will depend on how fast factorials (n!) Can be calculated. If a straightforward calculation is used, then the time complexity for one connection and one area is O(m+n). The time complexity for one connection and all areas (see FIG. 2) is $O(M_{DP}N_{DP}(m+n))$.

Finally, the time complexity for all N connections and all areas is $O(M_{DP}N_{DP}N(m+n))$. There are several ways how to deduce the time complexity, especially for long connections with large m and n. One method is to use the Sterling formula for factorial calculation:

$$n! = e^{(n+0.5)\cdot \ln n - n + \ln \sqrt{2\pi}} \qquad (10)$$

Then, the time complexity becomes $O(M_{DP}N_{DP}N)$. The same time complexity and even better time can be obtained if factorials of integer numbers are tabulated in advance for the range of approximately [1–100].

The time efficient method (time complexity is proportional to the product of the connections and areas) described above can be used to accurately estimate horizontal and vertical wire density in different areas of datapath or hardmac. The approach is a good probabilistic model for connections going through areas with high wire density. The model differentiates between horizontal and vertical segments, and takes into account all possible shortest length configurations of connections. The model also provides for the calculation of a congestion map.

However, the approach described above has the following two drawbacks for chip areas with low and middle wire density. First, it assumes that the connection can have any configuration with the same probability. This is not always true as the connection more likely has a configuration with a small number of bends in chip areas with low and middle wire density. Second, it assumes that the probability of any connection configuration that goes through or near the center of the bounding box (i.e. rectangle [a,b,c,d]) (see FIG. 8) around the connection is higher than for other configurations. This is not always true as it will depend on the location of other pins and wires.

A better approach uses the model with minimum bends in areas with low wire density, and uses models with more bends in areas with middle and high wire density. The rule is: "the more wire density the more bends in the model". First, the model with minimum bends is found, then the model is used recursively to build other models with more bends.

Figure 8:
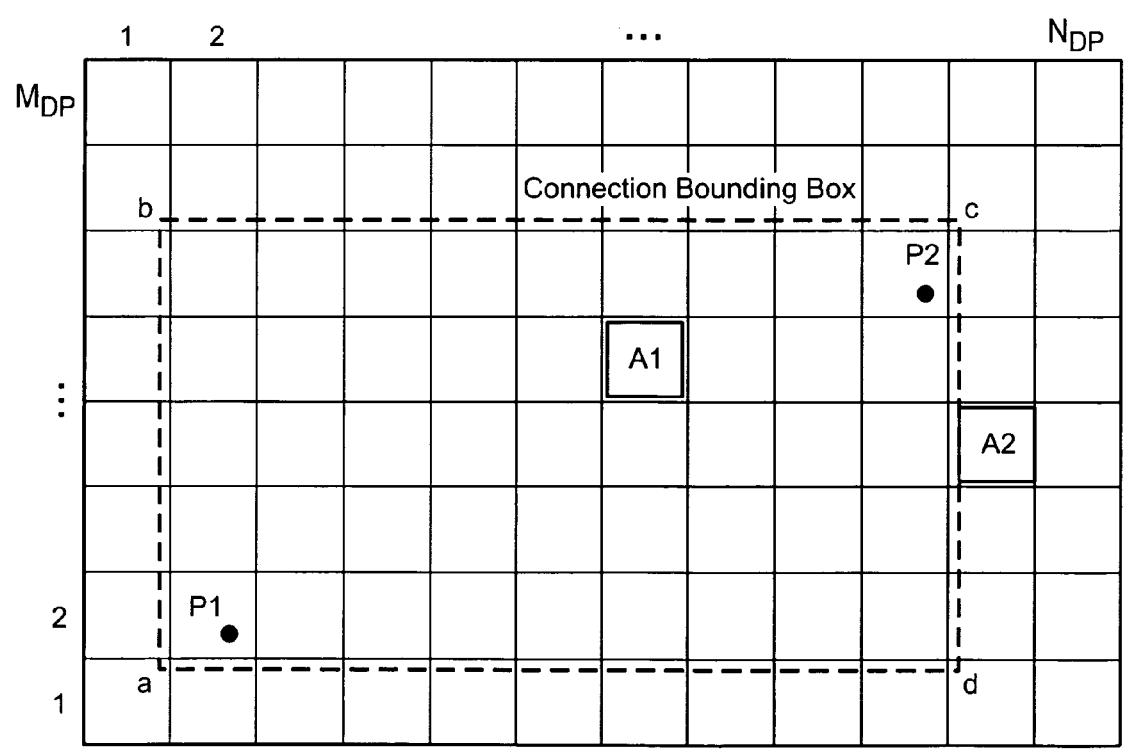
FIG. 8 is a general schematic diagram showing a datapath area divided into square areas and a bounding area [a,b,c,d] defined in the datapath.

Initially, the chip is divided into $M_{DP}$ by $N_{DP}$ squared areas as shown in FIG. 8, where each area size is about equal to the width of placement columns (or cell width) (in some cases the chip may be rotated 90 degrees, hence there are no placement columns, but rather placement rows).

The minimum bends model (i.e. model 1) describes all connection configurations with only one bend and the shortest length. FIGS. 9a and 9b show these configurations for connection C from pin P1 to pin P2.

The probability P(a) for each area A of the connection bounding box [a,b,c,d] to have the connection (P1, P2) will now be found (see FIG. 10). For any area A1 from [a,b,c,d] there exists some probability P(A)>0 that connection (P1, P2) will go through this area, and for any area A outside [a,b,c,d] there is zero probability that connection (P1, P2) will go through this area. If probability P(A) is known, then the mathematical expectation of area A having connection (P1, P2) is M(A)=P(A). Any connection (P1, P2), where P1 is lower than P2, con go through area A in four different ways as shown in FIG. 10. The case where pins P1 and P2 are placed as shown in FIGS. 9a and 9b will be considered. For the situation where pin P1 is higher than pin P2, the analysis will be analogous.

Figures 11A, 11B:
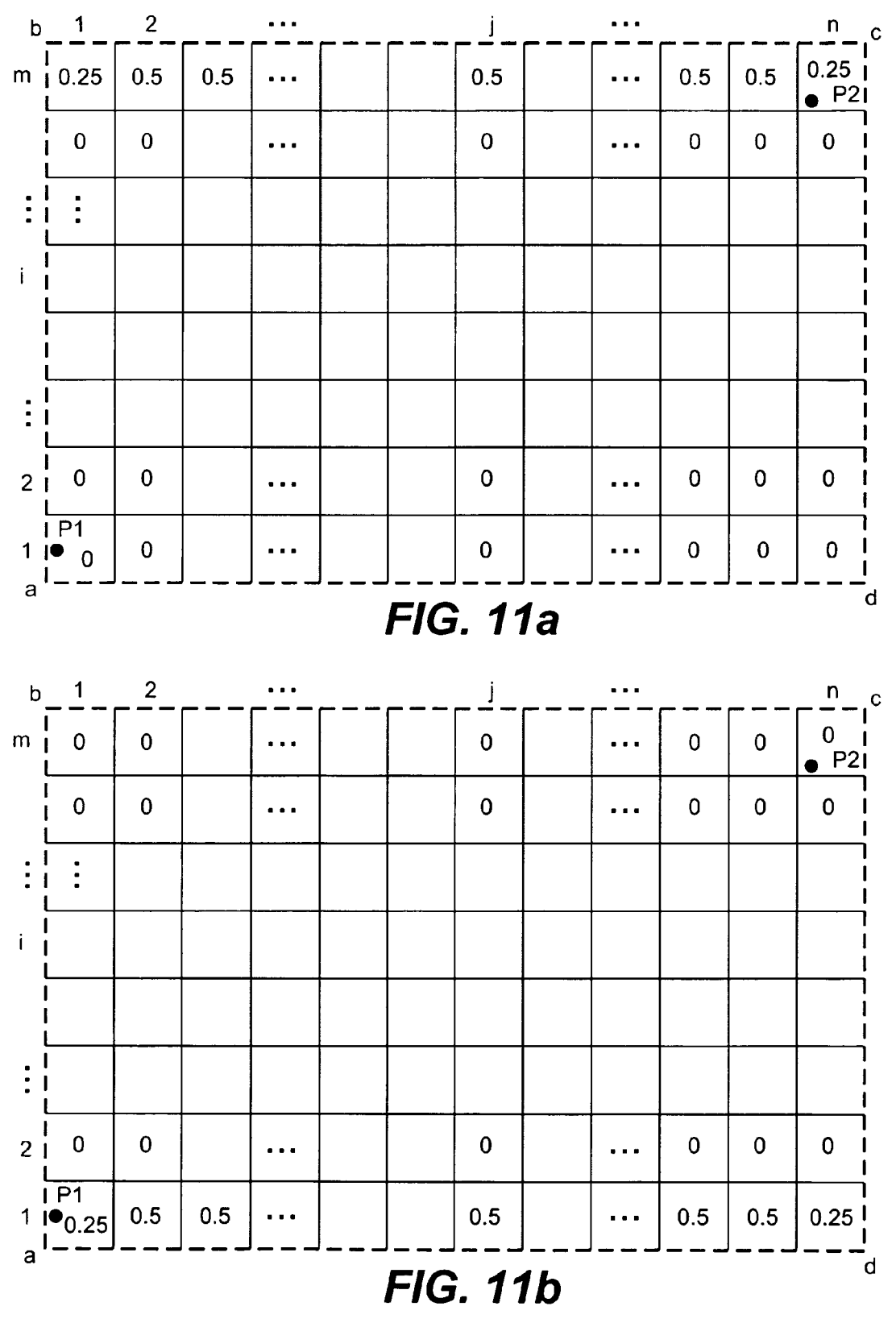

FIG. 11a shows the bounding box [a,b,c,d] (see FIG. 10) (FIGS. 10, 11a, 11b, 12, 13 and 15–17 also show the numeration of the columns and rows which form the rectangle or bounding box [a,b,c,d]), and all horizontal probabilities (mathematical expectations) for the configuration shown in FIG. 9a. Areas with a full horizontal segment have 0.5 probability, because there are only two possible configuration, while areas with a half horizontal segment have 0.25 probability, because these areas contain about 0.5 part of the segment and there are only two possible configurations. FIG. 11b shows all the horizontal probabilities for the configuration shown in FIG. 9b.

The whole mathematical expectation $M_h(A)$ can be found as a sum:

$$M_h(A) = M_{h1}(A) + M_{h2}(A) \qquad (11)$$

of mathematical expectations for both configurations shown in FIG. 11 (see FIG. 12). The formula for mathematical expectation $M_h(A)$ is as follows:

$$M_h(A) = 0.5 \text{ if } i=1 \text{ and } j=2, 3, \ldots, n-1 \qquad (12)$$

$$M_h(A) = 0.5 \text{ if } i=m \text{ and } j=2,3, \ldots, n-1 \qquad (13)$$

$$M_h(A) = 0.25 \text{ if } i=1 \text{ and } j=1 \text{ or } j=n \qquad (14)$$

$$M_h(A) = 0 \text{ if } i=2, 3, \ldots, m-1 \text{ and } j=1, 2, \ldots, n, \qquad (15)$$

where local (inside [a,b,c,d]) numeration of rows and columns is used.

The same formulas can be used for horizontal segments when point P1 is higher than point P2.

To determine the mathematical expectation $M_h^{All}(A)$ of all horizontal segments of all the connections, the following summation is calculated:

$$M_h^{All}(A) = \sum_{c \in Connections} M_h^c(A) \qquad (16)$$

where $M_h^c(A)$ $M_h(A)$ is the whole mathematical expectation of horizontal segments in area A for one connection c.

The same approach is used to obtain formulas for vertical segments (see FIG. 13):

$$M_v(A) = 0.5 \text{ if } j=1 \text{ and } i=2, 3, \ldots, m-1 \qquad (17)$$

$$M_v(A) = 0.5 \text{ if } j=m \text{ and } i=2,3, \ldots, m-1 \qquad (18)$$

$$M_v(A) = 0.25 \text{ if } j=1 \text{ and } i=1 \text{ or } i=m \qquad (19)$$

$$M_v(A) = 0 \text{ if } j=2,3, \ldots, n-1 \text{ and } i=1,2, \ldots, m, \qquad (20)$$

where local (i.e. inside [a,b,c,d]) numeration of rows and columns is used.

The same formulas can be used for vertical segments when point P1 is higher than point P2.

To calculate the mathematical expectation $M_v^{All}(A)$ of all vertical segments of all the connections, the following summation is calculated:

$$M_v^{All}(A) = \sum_{c \in Connections} M_v^c(A) \qquad (21)$$

From the formulas above, it can be concluded that the time complexity of the model will depend on n and m. The time complexity for one connection is $O(m+n)$. The time complexity for all N connections is $O(N(m+n))$.

Next, the obtained formulas for one bend configurations are recursively used to find models with 2, 3 . . . bends. With regard to a connection configuration with two bends, there are two possible types of configurations, and these are shown in FIGS. 14a and 14b.

Figure 14A:
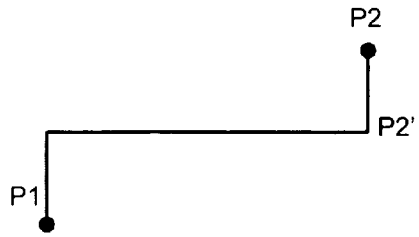
FIGS. 14a and 14b show two different two bends configurations.
Figure 14B:
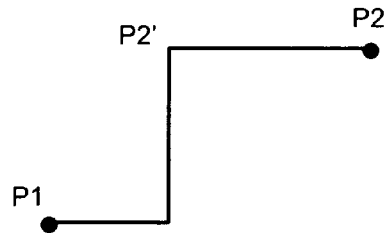
Figure 15:
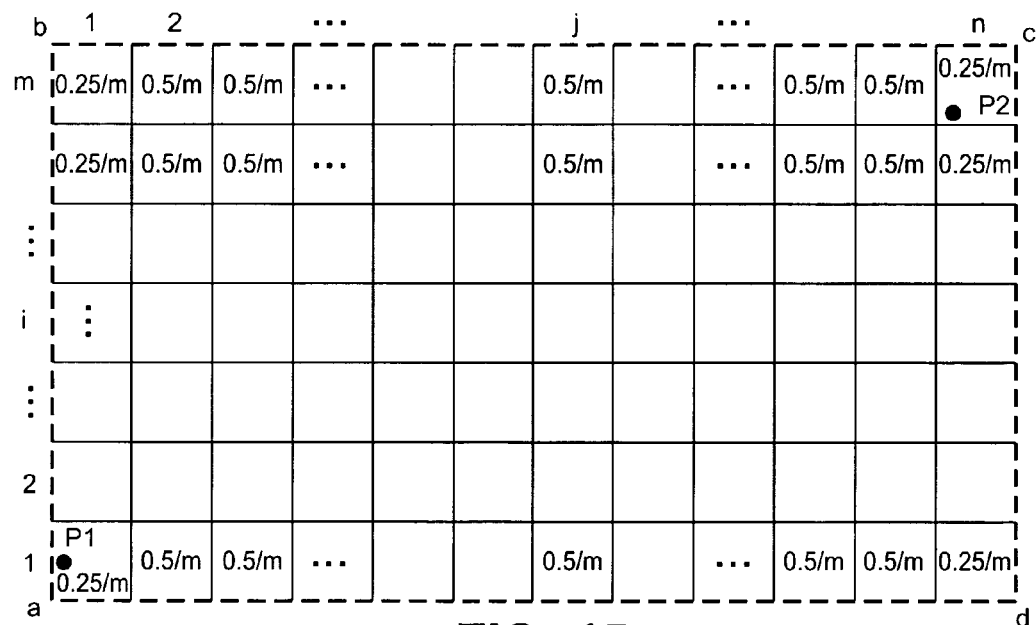

To determine all mathematical expectations, two bend configurations are considered as a combination of all possible one bend configurations (P1, P2'). There are m possible locations for P2' for the configurations shown in FIG. 14b. The whole mathematical expectation $M_h(A)$ can be found as a sum:

$$M_h(A) = M_{h1}(A) + M_{h2}(A) + \ldots + M_h(m+n)(A) \quad (22)$$

of mathematical expectations for all possible configurations in FIG. 14. FIG. 15 shows the mathematical expectations for the configuration shown in FIG. 14a, while FIG. 16 shows the mathematical expectations for the configuration shown in FIG. 14b. FIG. 17 shows the overall horizontal mathematical expectations.

The formula for mathematical expectation $M_h(A)$ is as follows:

| | | |
|---|---|---|
| (23) | $M_h(A) = 0.5(mn + n - (j - 1)m)/nm$ | if $i = 1$ and $j = 2, 3, \ldots, n - 1$ |
| (24) | $M_h(A) = 0.5(jm + n)/nm$ | if $i = m$ and $j = 2, 3, \ldots, n - 1$ |
| (25) | $M_h(A) = 0.25(m + 1)/m$ | if $i = 1$ and $j = 1$ |
| (26) | $M_h(A) = 0.25(n + m)/nm$ | if $i = m$ and $j = 1$ or $j = n$ |
| (27) | $M_h(A) = 0.25(m + 1)/nm$ | if $i = m$ and $j = n$ |
| (28) | $M_h(A) = 0.5/m$ | if $i = 2, 3, \ldots, m - 1$ and $j = 1, 2, \ldots, n,$ | where local (i.e. inside [a,b,c,d]) numeration of rows and columns is used.

The same formulas can be used for horizontal segments when point P1 is higher than point P2. The same approach can be used to obtain formulas for vertical segments:

| | | |
|---|---|---|
| (29) | $M_v(A) = 0.5(mn + m - (i - 1)n)/nm$ | if $j = 1$ and $i = 2, 3, \ldots, m - 1$ |
| (30) | $M_v(A) = 0.5(in + m)/nm$ | if $j = n$ and $i = 2, 3, \ldots, m - 1$ |
| (31) | $M_v(A) = 0.25(n + 1)/n$ | if $j = 1$ and $i = 1$ |
| (32) | $M_v(A) = 0.25(n + m)/nm$ | if $j = n$ and $i = 1$ or $i = m$ |
| (33) | $M_v(A) = 0.25(n + 1)/nm$ | if $j = n$ and $i = m$ |
| (34) | $M_v(A) = 0.5/n$ | if $j = 2, 3, \ldots, n - 1$ and $i = 1, 2, \ldots, m,$ | where local (i.e. inside [a,b,c,d]) numeration of rows and columns is used.

From the formulas above, it can be concluded that the time complexity of the model will depend on n and m. The time complexity for one connection and one area is O(mn). The time complexity for all N connections is O(Nmn). With the increase of bends in the model, the time complexity also increases.

Figure 18A:
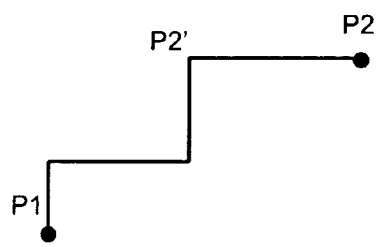
FIGS. 18a and 18b show two different three bends configurations.
Figure 18B:
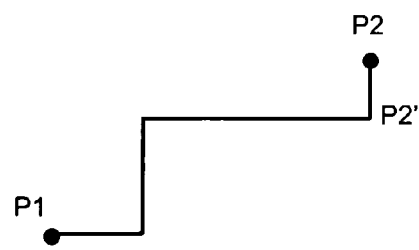

A three bends model will now be outlined. To arrive at the three bend model, the obtained formulas for the two bend configuratiosn will be used. FIGS. 18a and 18b show the two possible three bend configurations. To determine all the mathematical expectations, the three bend configurations are considered as being a combination of all possible two bend configurations (P1, P2'). There are n possible locations for P2' for the configuration shown in FIG. 18a, and m possible locations for P2' for the configuration shown in FIG. 18b. Using the approach described above recursively, a model with any given number of bends can theoretically be built. However, the calculations to build k-bends ($k \geq 3$) models may be such that such a model would be impractical in light of the large expense compared to the relatively small improvement in accuracy. To increase the speed of all the calculations, all possible matrices for the mathematical expectations for given sizes of connections m and n can be tabulated (there will be mn matrices for each model). Then, for any k-bends model, the time complexity for all N connections will always be O(Nmn) due to the fact that the time for tabulation can be ignored since the tabulation is only perormed once.

The time efficient models described above can be used to accurately estimate horizontal and vertical wire density in different areas of datapath or hardmac. These models take into account all possible minimal bends and shortest length configurations of the connection. Thus, these models are accurate enough to be used for wire density estimation in areas with low, middle and high wire density. Preferably, the model with minimum bends is used in areas with low wire density, and models with more bends are used in areas with middle and high wire density.

While embodiments of the present invention are shown and described, it is envisioned that those skilled in the art may devise various modifications of the present invention without departing from the spirit and scope of the appended claims.

What is claimed is:

1. A method of forming a congestion map by calculating a probability that a wire path in a pre-determined direction will be contained in a given area within a datapath, said method comprising:
   dividing the datapath into pre-determined areas to define said given area;
   calculating the mathematical expectations of full segments in the pre-determined direction for said given area in said datapath;
   calculating the mathematical expectations of partial segments in the pre-determined direction for said given area in said datapath;
   summing the mathematical expectations which have been calculated to determine the probability that a wire path in the pre-determined direction will be contained in the given area within the datapath; and
   entering the probability on the congestion map.

2. A method as recited in claim 1, further comprising calculating the probability for each connection in the datapath.

3. A method as recited in claim 2, further comprising summing the probabilities to calculate the whole mathematical expectation of segments in the pre-determined direction in the given area for all the connections in the datapath.

4. A method as recited in claim 1, further comprising calculating the mathematical expectations of full horizontal segments for said given area in said datapath.

5. A method as recited in claim 1, further comprising calculating the mathematical expectations of partial horizontal segments for said given area in said datapath.

6. A method as recited in claim 1, further comprising calculating the mathematical expectations of full horizontal segments for said given area in said datapath, and calculating the mathematical expectations of partial horizontal segments for said given area in said datapath.

7. A method as recited in claim 6, further comprising summing the mathematical expectations which have been calculated to determine the probability that a wire path in the horizontal direction will be contained in the given area within the datapath.

8. A method as recited in claim 1, further comprising calculating the mathematical expectations of full vertical segments for said given area in said datapath.

9. A method as recited in claim 1, further comprising calculating the mathematical expectations of partial vertical segments for said given area in said datapath.

10. A method as recited in claim 1, further comprising calculating the mathematical expectations of full vertical segments for said given area in said datapath, and calculating the mathematical expectations of partial vertical segments for said given area in said datapath.

11. A method as recited in claim 10, further comprising summing the mathematical expectations which have been calculated to determine the probability that a wire path in the vertical direction will be contained in the given area within the datapath.

12. A method as recited in claim 1, further comprising calculating the mathematical expectations of full horizontal segments for said given area in said datapath and calculating the mathematical expectations of full vertical segments for said given area in said datapath.

13. A method as recited in claim 12, further comprising calculating the mathematical expectations of partial horizontal segments for said given area in said datapath and calculating the mathematical expectations of partial vertical segments for said given area in said datapath.

14. A method as recited in claim 1, further comprising calculating the mathematical expectations of full horizontal segments for said given area in said datapath, calculating the mathematical expectations of partial horizontal segments for said given area in said datapath, summing the mathematical expectations relating to horizontal segments which have been calculated to determine the probability that a wire path in the horizontal direction will be contained in the given area within the datapath, calculating the mathematical expectations of full vertical segments for said given area in said datapath, calculating the mathematical expectations of partial vertical segments for said given area in said datapath, and summing the mathematical expectations relating to vertical segments which have been calculated to determine the probability that a wire path in the vertical direction will be contained in the given area within the datapath.

* * * * *